United States Patent
Kodama et al.

(10) Patent No.: US 10,600,489 B2
(45) Date of Patent: Mar. 24, 2020

(54) MEMORY SYSTEM, READING METHOD, PROGRAM, AND MEMORY CONTROLLER

(71) Applicant: TOSHIBA MEMORY CORPORATION, Tokyo (JP)

(72) Inventors: Tomoya Kodama, Kawasaki Kanagawa (JP); Takayuki Itoh, Kawasaki Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/120,093

(22) Filed: Aug. 31, 2018

(65) Prior Publication Data
US 2019/0279728 A1     Sep. 12, 2019

(30) Foreign Application Priority Data
Mar. 7, 2018   (JP) .................... 2018-041166

(51) Int. Cl.
| G11C 16/10 | (2006.01) |
| G11C 16/34 | (2006.01) |
| G11C 11/56 | (2006.01) |
| G11C 16/26 | (2006.01) |
| G11C 29/44 | (2006.01) |
| G11C 8/12  | (2006.01) |
| G06K 9/62  | (2006.01) |
| G11C 29/42 | (2006.01) |

(52) U.S. Cl.
CPC ........ *G11C 16/3404* (2013.01); *G06K 9/6223* (2013.01); *G11C 8/12* (2013.01); *G11C 11/5628* (2013.01); *G11C 11/5642* (2013.01); *G11C 16/10* (2013.01); *G11C 16/26* (2013.01); *G11C 29/42* (2013.01); *G11C 29/44* (2013.01); *G11C 2211/561* (2013.01)

(58) Field of Classification Search
CPC ... G11C 16/3404; G11C 8/12; G11C 11/5628; G11C 11/5642; G11C 16/10; G11C 16/26; G11C 29/42; G11C 2211/561; G06K 9/6223
USPC ........................................ 365/185.01–185.33
See application file for complete search history.

(56) References Cited

U.S. PATENT DOCUMENTS

| 9,595,320 B2 * | 3/2017 | Wu ................ G11C 16/26 |
| 2018/0276072 A1 | 9/2018 | Kodama et al. |
| 2019/0279724 A1 | 9/2019 | Itoh et al. |

FOREIGN PATENT DOCUMENTS

| JP | 2019153366 A | 9/2019 |
| WO | 2013099387 A1 | 7/2013 |

OTHER PUBLICATIONS

Japanese Application No. 2018-039775.
(Continued)

*Primary Examiner* — Harry W Byrne
(74) *Attorney, Agent, or Firm* — Kim & Stewart LLP

(57) ABSTRACT

According to one embodiment, a memory system includes memory cells capable of having data written therein at different write levels. A memory controller is configured to detect first data of the memory cells, then apply a first voltage that is lower than a voltage used for writing the data to the plurality of memory cells, detect second data of the memory cells after the first voltage has been applied, and estimate a write level for the data written to the memory cells based on a comparison of the first data and the second data.

10 Claims, 9 Drawing Sheets

(56) References Cited

OTHER PUBLICATIONS

Shuhei Tanakamaru et al., Error-Prediction LDPC and Error-Recovery Schemes for Highly Reliable Solid-State Drives (SSDs), IEEE Journal of Solid-State Circuits, vol. 48, No. 11, Nov. 2013, pp. 2920-2933.

* cited by examiner

MEMORY SYSTEM, READING METHOD, PROGRAM, AND MEMORY CONTROLLER

CROSS-REFERENCE TO RELATED APPLICATION

This application is based upon and claims the benefit of priority from Japanese Patent Application No. 2018-041166, filed Mar. 7, 2018, the entire contents of which are incorporated herein by reference.

FIELD

Embodiments described herein relate generally to a memory system, a reading method, a program, and a memory controller.

BACKGROUND

As the storage density of NAND flash memories used for solid state drives (SSDs) and memory cards is increased, reliability becomes a problem. Factors that influence reliability include factors such as the charge amount stored in a memory cell, variation in charges due to interference with the surrounding memory cells, charge migration accompanying reading, and a change over time in the charge amount.

A technique has been proposed to reduce read errors caused by fluctuations in the charge amount by injecting charges into a charge storage layer by applying a voltage.

However, in the related art, individual differences in the extent or degree of charge migration for each memory cell are not taken into consideration, and therefore a write level for each particular memory cell may not be estimated with higher accuracy.

DETAILED DESCRIPTION

Figure 1:
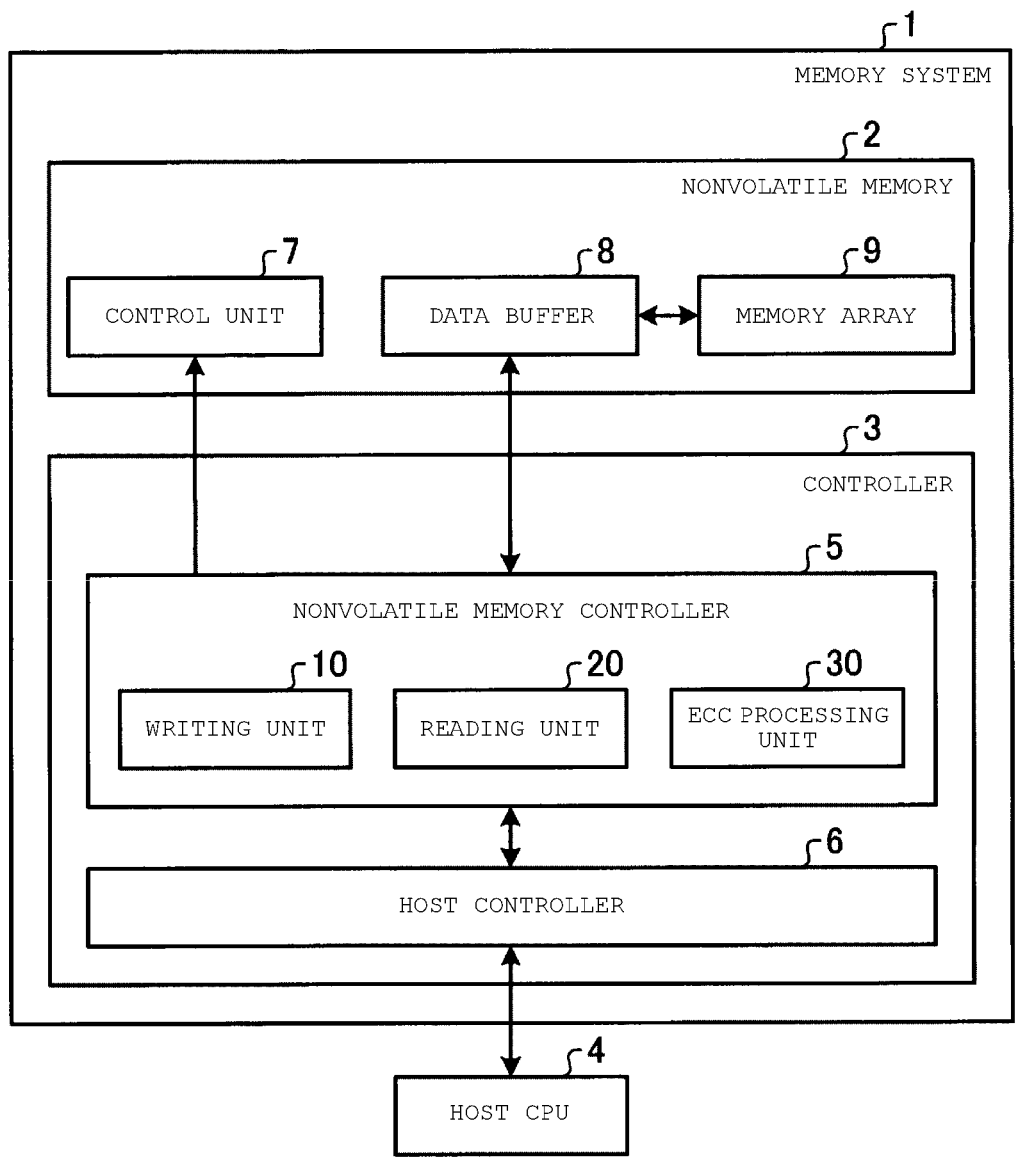
FIG. 1 is a block diagram showing a configuration example of a memory system.

In general, according to one embodiment, a memory system includes a plurality of memory cells capable of having data written therein at a plurality of write levels and a memory controller. The memory controller is configured to detect first data of the plurality of memory cells, then apply a first voltage that is lower than a voltage used for writing the data, to the plurality of memory cells, detect second data of the plurality of memory cells after the first voltage has been applied, and estimate a write level for the data written to the plurality of memory cells based on a comparison of the first data and the second data.

Hereinafter, a memory system, a reading method, a program for controlling aspects of a memory system, and a memory controller according to example embodiments will be described with reference to the accompanying drawings. In the following description, the same reference numerals are given to elements having substantially similar functions, and redundant description may be appropriately omitted.

As described above, various factors affect the reliability of a nonvolatile memory such as a NAND flash memory. For example, if the thickness of a tunnel layer through which charges are exchanged is reduced, for example, in conjunction with an overall scaling down of the memory cells, then charges stored in a charge storage layer (also referred to as a charge trap layer) will increasingly tend to be lost over time. As a result, data retention time decreases. As described above, each individual memory cell of a nonvolatile memory has a characteristic threshold voltage that may shift due to changes over time after writing. When the amount of charges retained in a memory cell fluctuates, a mismatch occurs between written data (as-written data) and the read data (as-read data read from the memory cell subsequent to writing), resulting in a read error (bit error) for the memory cell.

As a method for improving the reliability of the flash memory, a technique has been proposed in which charges are injected into the charge storage layer to reduce bit errors. However, in order to sufficiently reduce bit errors by such a method, experimental results show that it is necessary to apply a voltage as several hundred pulses for charge injection. This indicates that a large amount of processing time would be required for sufficiently reducing bit errors by this method. Therefore, it would seem impossible to sufficiently reduce bit errors by the method within the limited time typically available in nonvolatile memory systems.

First Embodiment

The memory system according to a first embodiment estimates a write level for a memory cell by noting that the memory cells which are likely to lose charge during data retention (that is, after writing) are also those memory cells most easily affected by reading disturb. Since it is possible to take individual differences in degree of charge migration into account for these particular memory cells, it is possible to estimate write levels for the memory cells with higher accuracy.

FIG. 1 is a block diagram showing a configuration example of a memory system 1 including a memory control according to the present embodiment. The memory system 1 shown in FIG. 1 includes a nonvolatile memory 2 and a controller 3 and operates in accordance with commands from a host CPU 4. The nonvolatile memory 2 is, for example, a NAND flash memory.

A write command and a read command are sent from the host CPU 4 to the controller 3. The controller 3 controls the nonvolatile memory 2 in accordance with commands from the host CPU 4, writes data to the nonvolatile memory 2, and reads data from the nonvolatile memory 2. FIG. 1 shows an example in which the nonvolatile memory 2 and the controller 3 are provided so as to correspond one-to-one, but the controller 3 may also be configured to control a plurality of nonvolatile memories 2.

The controller 3 includes a nonvolatile memory controller 5 and a host controller 6. The nonvolatile memory controller 5 in the controller 3 or the controller 3 itself can be considered to correspond to a memory controller according to the present embodiment.

The host controller 6 transmits and receives data in accordance with commands issued from the host CPU 4. Specifically, the host controller 6 performs processing such as converting address information (generally, called LBA: Logical Block Address) indicated by the host CPU 4 into a physical address space of the nonvolatile memory 2.

The nonvolatile memory controller 5 controls the nonvolatile memory 2 based on a signal sent from the host controller 6. Specifically, the nonvolatile memory controller 5 sends commands and addresses to the nonvolatile memory 2 to write data and read data.

The nonvolatile memory controller 5 includes a writing unit 10, a reading unit 20, and an error correction code (ECC) processing unit 30.

The writing unit 10 writes data to the nonvolatile memory 2 by sending command and address information to the nonvolatile memory 2 and data to be written. The data sent as write data from the host CPU 4 can be encoded or otherwise processed by the ECC processing unit 30 and this encoded/ECC processed data is converted into data to be written in the nonvolatile memory 2. Processing for randomizing the data physical addressing may be added in order to equalize the read/write stress of individual memory cells of the nonvolatile memory 2 after the error correction coding.

Writing of data to the nonvolatile memory 2 is performed by setting threshold voltages of individual memory cells of a memory cell group specified by address information to a voltage level corresponding to the data (hereinafter, referred to as "write data") being written. That is, the write data is stored according to the threshold voltages of individual memory cells of the memory cell group.

The reading unit 20 reads data from the nonvolatile memory 2 by sending command and address information to the nonvolatile memory 2. The data read from the nonvolatile memory 2 can be subjected to error correction by the ECC processing unit 30.

Reading of data from the nonvolatile memory 2 is performed by detecting threshold voltages of individual memory cells of the memory cell group to which the write data was previously written. As noted, the threshold voltage of the memory cell of the nonvolatile memory 2 fluctuates depending on various factors, but in the present embodiment, with respect to individual memory cells of the memory cell group to which write data is written, it is possible to favorably reduce bit errors by detecting two kinds of threshold voltages when reading and then estimating write data accordingly.

Figure 2:
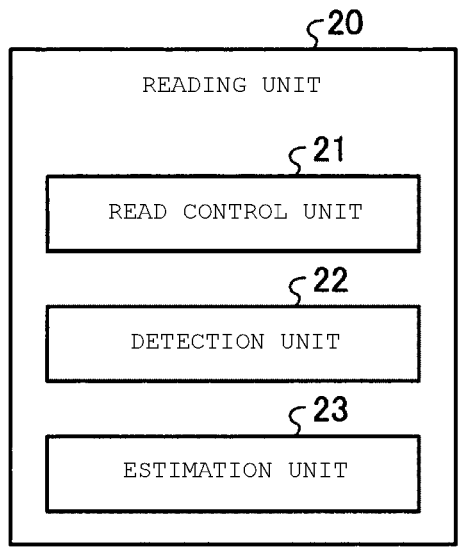
FIG. 2 is a block diagram showing a configuration example of a reading unit.

FIG. 2 is a block diagram showing a configuration example of the reading unit 20 in the present embodiment. The reading unit 20 includes a read control unit 21, a detection unit 22, and an estimation unit 23.

The read control unit 21 selects a memory cell to be read (referred to as a "read cell") from the memory cell group of the nonvolatile memory 2 to which write data was written and sends a control command for acquiring the threshold voltage and a control command for applying a predetermined voltage to the nonvolatile memory 2.

The control command for applying a predetermined voltage is a control command for applying a first voltage for causing a read disturb in the read cell. For example, the read control unit 21 issues a read command addressed to memory cells on another word line included in the same memory array as the read cell a plurality of times. In this manner, it is possible to apply a pass voltage to the read cell to generate a fluctuation in the threshold voltage due to read disturb.

The pass voltage is, for example, a voltage determined so that the memory cells are always in an ON state with respect to the word lines other than the word line including the read cell. The pass voltage is an example of the predetermined voltage (first voltage). The first voltage may be a voltage (for example, 6 to 7 V) which is lower than the voltage (for example, 10 V) used for writing and is approximately equal to the pass voltage.

Here, the read disturb is utilized to slightly change (or shift) the threshold voltage by applying a voltage lower than the program voltage to the control gate 55, and the applied voltage induces charge injection from a channel 51 to a charge trap layer 53. Therefore, it is only necessary to apply the predetermined voltage to the control gate 55 for some time by providing a dedicated function in the nonvolatile memory 2 in some form instead of relying on normal occurrences of read disturb. Since it is generally sufficient that the threshold voltage of the read cell may be varied, the predetermined voltage may be a positive voltage or a negative voltage. In the following description, this intended phenomenon which is similar to read disturb and the unintended read disturb phenomenon are not distinguished from each other and both may be referred as read disturbs.

The detection unit 22 detects read data (first read data) from the read cell before the application of the first voltage and read data (second read data) from the read cell after the application of the first voltage. Here, the read data is data value as read from the read cell, and in the present embodiment, is the data corresponds to the threshold voltage of the memory cell being read. For example, in response to the control command sent by the read control unit 21, the detection unit 22 detects a plurality of threshold voltages VthA (the first threshold voltages) before the first voltage has been applied and then detects a plurality of threshold voltages VthB (the second threshold voltages) after the first voltage has been applied, from the memory cells being read (read cells).

Based on the threshold voltages VthA and the threshold voltages VthB detected by the detection unit 22, the estimation unit 23 estimates write levels corresponding to the write data as-written in the memory cells being read. For example, the estimation unit 23 estimates a boundary line that separates points on a feature space defined by the threshold voltages VthA and the threshold voltages VthB into a plurality of different write levels and estimates write levels corresponding to the write data based on the estimated boundary line(s).

The estimation unit 23 may estimate and output write data corresponding to the estimated write levels. The estimation unit 23 may estimate a log likelihood ratio used for soft decision error correction as the write levels. For example, the estimation unit 23 may obtain the log likelihood ratio by extending the method of obtaining the log likelihood ratio from the threshold voltage of the memory cell on the two-dimensional feature space.

As a result of error correction performed by the ECC processing unit 30 on read data acquired by a first read command for the read cell, which is sent out by the read control unit 21, in a case in which all the read data errors are corrected, the processing in the detection unit 22 and the estimation unit 23 is omitted. If the error correction fails, the estimation processing is performed by the detection unit 22 and the estimation unit 23, and the error correction processing is executed in the ECC processing unit 30 on the estimated write data, and the write data is reproduced therefrom.

In a case where the controller 3 or the nonvolatile memory controller 5 does not include an ECC processing unit 30 (for example, in the case where the functions of the detection unit 22 and the estimation unit 23 are provided within the nonvolatile memory 2), the processing by the detection unit 22 and the estimation unit 23 may be executed regardless of the result of the error correction.

The nonvolatile memory 2 includes a control unit 7, a data buffer 8, and a memory array 9. The control unit 7 interprets commands and address information issued from the controller 3 and controls the data buffer 8 and the memory array 9. The write data is temporarily stored in the data buffer 8 and then written in the memory array 9. In the case of reading, the data read from the memory array 9 is temporarily stored in the data buffer 8 and is then sequentially sent to the controller 3.

Figure 3:
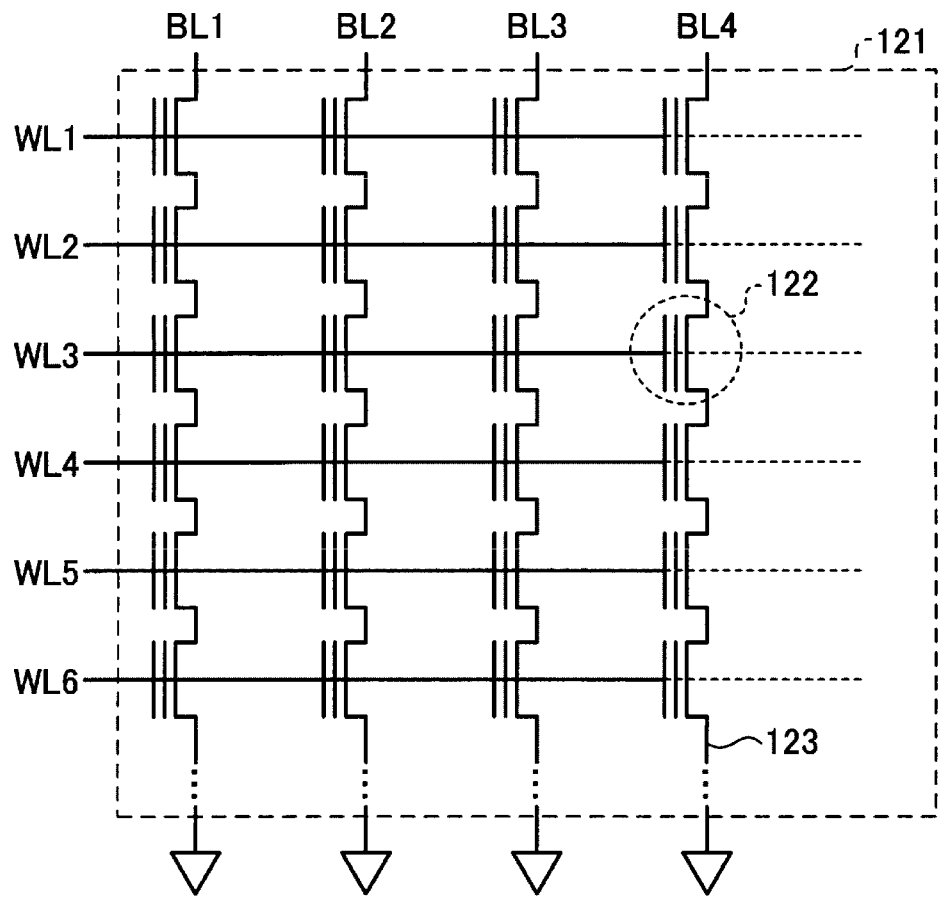
FIG. 3 is a diagram for explaining a structure of a memory array of a nonvolatile memory.

FIG. 3 is a diagram for explaining the structure of the memory array 9. As shown in FIG. 3, the memory array 9 has a plurality of circuits 123 called NAND strings in which a plurality of transistors 122 (each transistor is a "memory cell") are arranged in series. A wire connected to one NAND string is called a bit line (BL). The gate electrodes of the transistors at the same position along the different bit lines are connected to each other by a word line (WL).

In FIG. 3, only four bit lines (BL1 to BL4) and only six word lines (WL1 to WL6) are shown, but in fact, there will be more bit lines, word lines, and memory cells in an array. This entire array is referred to as a block 121. Normally, a plurality of blocks 121 (or the like) are present in the nonvolatile memory 2.

In the nonvolatile memory 2, data (write data) of 1 to 4 bits can be recorded in a single memory cell (transistor) according to a variable threshold voltage. A nonvolatile memory in which only one bit data is recorded in each memory cell is called a single level cell (SLC). A multi-level cell (MLC) is used for 2 bits, a triple-level cell (TLC) is used for 3 bits, and a quad level cell (QLC) is used for 4 bits. One-bit data recorded in memory cells connected to a single word line is collectively called a page. That is, data of 1 page to 4 pages is recorded in the memory cell group connected to each word line.

Data is written to a memory cell by changing the threshold voltage of the memory cell (transistor). When reading, an appropriate voltage (this voltage is referred to as "read voltage") is applied to a word line corresponding to a memory cell group in which data to be read was written, and for the remaining (unaddressed) word lines, a pass voltage is applied such that the memory cells are in the ON state despite any data which might have been written thereto. The detection unit 22 detects whether the threshold voltage of each memory cell (transistor) of the memory cell group being read is higher or lower than the applied read voltage.

In memory cells other than the SLC-type, a plurality of read voltage levels are defined and measured one by one to read the written data. Error correction is performed on the read data by the ECC processing unit 30, and if the data may be corrected fully, the reading processing is completed thereby.

On the other hand, in a case where the amount of the stored charges changes as described above and the threshold voltage of the memory cell changes inadvertently, the ECC processing unit 30 may fail at the error correction processing. In such a case, the reading unit 20 repeats the detection processing while slightly adjusting the read voltage to obtain the threshold voltage of each memory cell.

Figure 4:
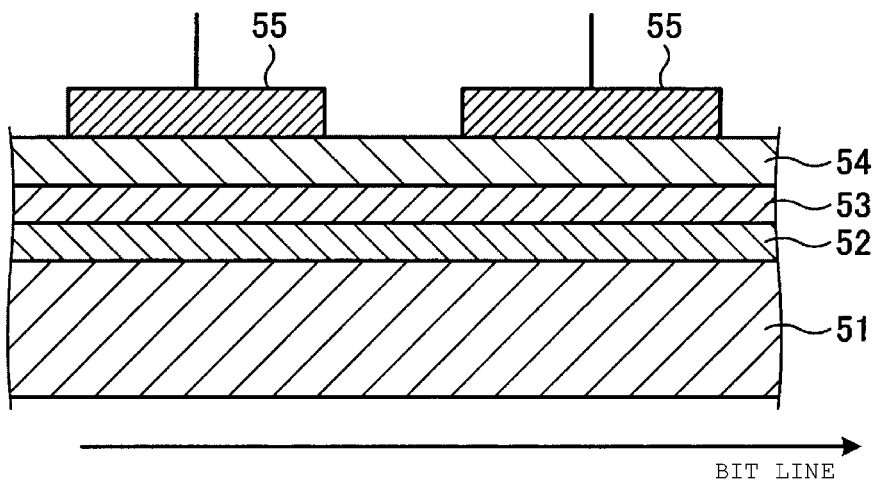
FIG. 4 is a cross-sectional view showing a structural example of memory cells of the nonvolatile memory.

FIG. 4 is a cross-sectional view showing a structural example of memory cells of the nonvolatile memory 2. The structure of the memory cell shown in FIG. 4 is called a charge trap type. The charge trap type memory cell has a structure in which the channel 51, the tunnel layer 52, the charge trap layer 53, an insulating layer 54, and the control gate 55 are stacked in this order. In the case of a two-dimensional nonvolatile memory, for example, the channel 51 is a substrate on which the tunnel layer 52 and the like are stacked.

In this structure, the charges are trapped in defects in the charge trap layer 53, whereby the threshold voltage of the memory cell changes. A high voltage pulse is applied between the control gate 55 and the channel 51 in order to trap charges for purposes of writing and to release (detrap) the trapped charges for purposes of erasing. By increasing or decreasing the number of times this high voltage pulse is applied, it is possible to control the amount of charges trapped in the charge trap layer 53, that is, set the threshold voltage of the memory cell.

Figure 5:
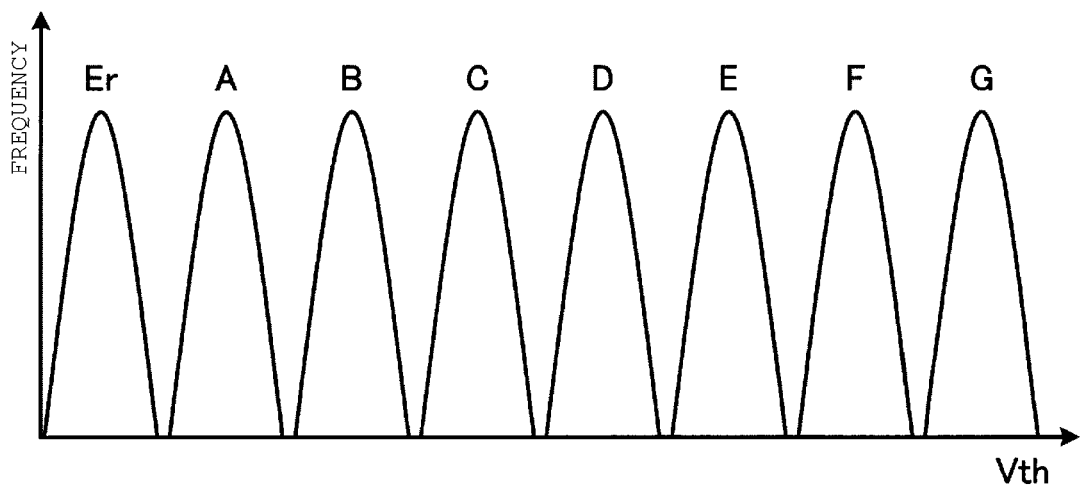
FIG. 5 is a diagram showing an example of a threshold voltage distribution of the memory cells.

For example, in a TLC nonvolatile memory, in addition to an erase level, which is in an initial state (e.g., state where the threshold voltage is the lowest), eight kinds of write levels are formed by writing seven different threshold voltages with program voltage pulses. The amount the threshold voltage varies with one program voltage pulse varies somewhat depending on the particular memory cell. For this reason, variations occur in the written threshold voltage, even at nominally same write level. Generally, the threshold voltage distribution at the same write level may be approximated as a normal distribution about the intended write level. That is, immediately after a programming, the threshold voltage distribution of the memory cells has a distribution as shown in FIG. 5. In FIG. 5, the eight write levels are referred to as Er, A, B, C, D, E, F, and G, respectively. In this manner, in each memory cell, a threshold voltage corresponding to write data is set according to one of a plurality of write levels.

The threshold voltage of each memory cell varies due to various factors. For example, cell-to-cell (CCI) interference is a phenomenon in which parasitic capacitance is generated between adjacent memory cells in addition to the memory cell being written and noise is added to the threshold voltages of the adjacent cells at the time of data writing because of the short distances between adjacent memory cells.

A read disturb is a phenomenon in which charges are slightly injected from the channel 51 to the charge trap layer 53 (and the threshold voltage thus varies) by application of a high pass voltage to the word lines other than the read cell at the time of reading.

A program disturb and pass disturb are phenomena in which the voltage between the control gate 55 and the channel 51 is increased even in non-targeted/addressed memory cells at the time of writing and an unintended charge injection occurs in the charge trap layer 53. Further, a phenomenon that charges trapped in the charge trap layer 53 escape (leaks) to the channel 51 over a long time also occurs. That is, there is a limit to the time that memory cells may retain previously written data, and the limited time is called data retention.

The phenomenon of charge migration related to data retention includes a case where charges move in the direction of the adjacent memory cells (horizontal direction in FIG. 4) and a case where charges move in the direction of the channel 51 (vertical direction in FIG. 4). In the present embodiment, most attention is paid to charge migration where charges move in the direction of the channel 51. As will be described later, since there are variations in the charge migration for each memory cell, the threshold voltages of memory cells having different nominal write levels will, over time, become mixed with each other and/or difficult to distinguish. Therefore, it may be impossible to accurately reproduce the as-written write levels of memory cells by merely classifying the as-read threshold voltages of the memory cells, and the frequency of such errors increases with time.

Charge migration issue related to data retention is described by a physical phenomenon called Fowler-Nordheim (F-N) tunneling. When electrons are stored in the charge trap layer 53, a negative potential difference is generated from the charge trap layer 53 to the channel 51. At this time, the shape of an energy barrier formed by the tunnel layer between the two is distorted by the potential difference, and the thickness thereof becomes thin. As a result, the probability of the tunneling phenomenon in which the charges existing in the charge trap layer 53 passes through the energy barrier and escapes to the channel 51 is increased.

Additionally, charge migration due to the above-described read disturbs may also be explained by F-N tunneling. When a positive pass voltage is applied to the control gate 55, a positive potential difference is generated from the control gate 55 to the channel 51. In this manner, a positive potential difference also occurs from the charge trap layer 53 toward the channel 51. As a result, in contrast to the above-described charge migration issue, the probability of the tunneling phenomenon in which charges are transmitted from the channel direction to the charge trap layer 53 is increased, and charges are stored in the charge trap layer 53.

The tunnel current generated by F-N tunneling depends on the magnitude of the electric field applied to the energy barrier as a result of applying the voltage as described above. Therefore, as the thickness of the tunnel layer becomes thinner, the tunnel current increases. In addition, as the number of defects generated in the tunnel layer increases due to the read/write stress, a tunneling phenomenon (trap-assisted Tunneling) through the defects increases and the tunneling current increases. Additionally, the individual memory cells have variations in the thickness of the tunnel layer and the amount and arrangement of defects in the tunnel layer. For this reason, variations occur in the tendency of F-N tunneling, that is, the tendency of threshold voltage shifts due to data retention and read disturb, for the individual memory cells. On the other hand, there is also a known relationship that memory cells in which charges leak easily during data retention are also memory cells susceptible to read disturb.

By taking advantage of such a relationship and taking the threshold voltage shift due to read disturb into account, it is possible to estimate a more accurate write level from a threshold voltage that may have varied during data retention. Specifically, the read control unit 21 first issues a read command addressed to the read cell. The detection unit 22 acquires the threshold voltage VthA of the read cell. Thereafter, the read control unit 21 issues a read command for different word lines of the same memory array a plurality of times. In this manner, a pass voltage is applied to the read cell, and a slight threshold voltage shift caused by read disturb is generated. Next, the read control unit 21 again issues a read command addressed to the read cell. The detection unit 22 acquires the threshold voltage VthB of the read cell. The estimation unit 23 then estimates a write level by using these two threshold voltages.

Figure 6:
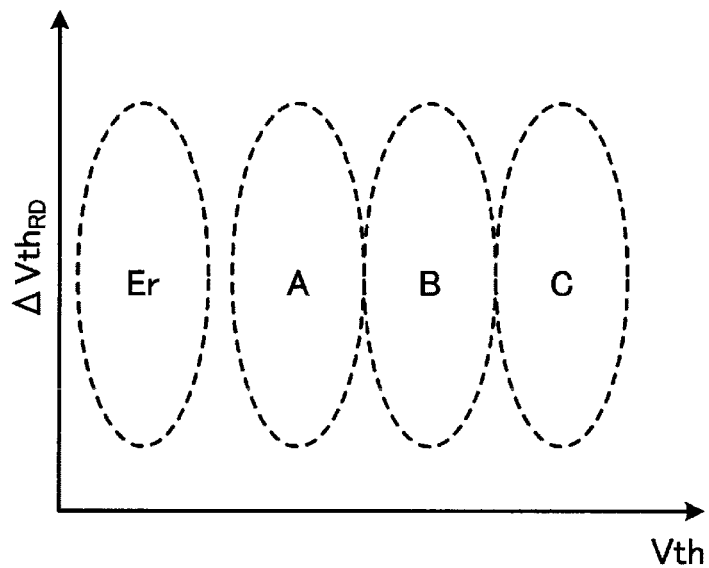
FIG. 6 is a diagram showing an example of the threshold voltage distribution of the memory cells.
Figure 7:
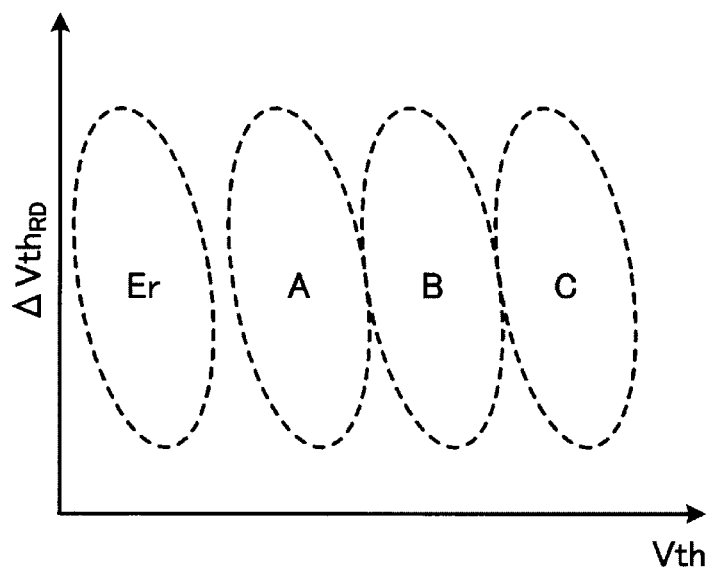
FIG. 7 is a diagram showing an example of the threshold voltage distribution of the memory cells.

The above processing will be described in more detail with reference to FIGS. 6 and 7. FIG. 6 is a diagram showing the relationship between the threshold voltage (Vth) for each write level immediately after writing to the nonvolatile memory 2 and a shift amount ($\Delta Vth_{RD}$) of the threshold voltage due to read disturb(s). The shift amount $\Delta Vth_{RD}$ of the threshold voltage is a difference between the threshold voltage VthB and the threshold voltage VthA. FIG. 7 is a diagram showing the relationship between the threshold voltage (Vth) and the shift amount ($\Delta Vth_{RD}$) of the threshold voltage after a lapse of time from writing.

Immediately after writing, since the threshold voltage has not yet been substantially influenced by data retention issues, the boundary line that separates the distribution of each write level is parallel to the axis of $\Delta Vth_{RD}$. On the other hand, as time elapses from the writing, the boundary line separating the distribution of the write levels is angled, as shown in FIG. 7. This is because the threshold voltage shift during data retention is different between a cell in which charges easily escape and a cell that is difficult to escape. It is possible to estimate a write level by obtaining this boundary line from the statistical properties of the read cell.

That is, the estimation unit 23 estimates a boundary line based on the assumption that the larger the difference between the threshold voltages VthA and the threshold voltages VthB, the larger the threshold voltage shifts due to the changes over time in data retention. For example, the estimation unit 23 estimates a boundary line by clustering points into a plurality of write levels. Then, the estimation unit 23 estimates a write level of each memory cell by determining which write level distribution the particular threshold voltage is included within, based on the boundary line.

Figure 8:
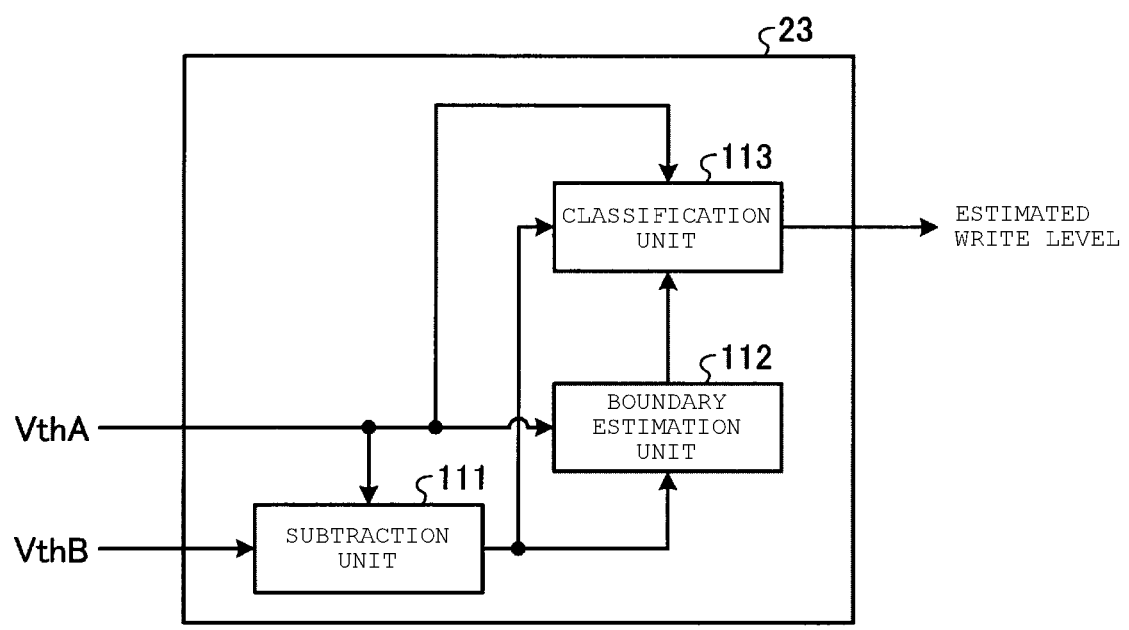
FIG. 8 is a block diagram showing a configuration example of an estimation unit.

Next, a detailed functional configuration example of the estimation unit 23 will be described. FIG. 8 is a block diagram showing an example of a configuration of the estimation unit 23. As shown in FIG. 8, the estimation unit 23 includes a subtraction unit 111, a boundary estimation unit 112, and a classification unit 113.

The subtraction unit 111 subtracts the threshold voltage VthA from the threshold voltage VthB according to the following equation (1) to calculate the shift amount $\Delta Vth_{RD}$ of the threshold voltage. $\Delta Vth_{RD}$ corresponds to the vertical axis of the graphs shown in FIGS. 6 and 7, and VthA corresponds to the horizontal axis of the graphs shown in FIGS. 6 and 7.

$$\Delta Vth_{RD} = VthB - VthA \qquad \text{equation (1)}$$

The boundary estimation unit 112 estimates a boundary line that separates the distribution of points corresponding to write levels on the feature space (two-dimensional feature space) determined by the threshold voltages VthA and the shift amounts $\Delta Vth_{RD}$ of the threshold voltages. For example, the boundary estimation unit 112 maps the threshold voltage VthA of each memory cell and the shift amount $\Delta Vth_{RD}$ to feature space to calculate the distribution of the threshold voltages as shown in FIGS. 6 and 7. On the feature space, a plurality of sets having different distribution shapes and average values are formed corresponding to different write levels.

These sets are distributions showing frequencies for each combination of the threshold voltages VthA and the shift amounts $\Delta Vth_{RD}$ of the threshold voltages. For example, in FIGS. 6 and 7, it is possible to interpret that the depicted sets have a mountain-shaped frequency distribution. The boundary estimation unit 112 may obtain a boundary line (identification line) separating adjacent write levels by obtaining a line slope that optimally divides a plurality of sets.

The boundary line may be obtained by using a technique called clustering, for example. In a case where a typical K-Means method is used as a clustering method, the boundary estimation unit 112 may obtain a boundary line between adjacent write levels by repeating processing of setting an initial representative vector of each write level on the feature space and grouping each memory cell so as to minimize the distance from the representative vector (for example, Mahalanobis distance) and processing of updating the representative vector of the write level, iteratively. The method of obtaining a boundary line is not limited to the K-Means method, and a method other than clustering may be used.

The boundary estimation unit 112 may separate the memory cells into groups of two or more according to the magnitude of $\Delta Vth_{RD}$, search valleys of the distributions on the VthA axis in each group, and use a straight line connecting the obtained plurality of valleys as a boundary line.

The classification unit 113 estimates a write level (estimated write level) for each memory cell by determining which set to be divided by the estimated boundary line is classified.

For example, in a case where clustering like the K-Means method is performed by the boundary estimation unit 112, the classification unit 113 outputs the estimated write level (estimated write level corresponding to the classified clustering) of each memory cell estimated by the boundary estimation unit 112 as it is. In a case where the boundary estimation unit 112 obtains only the boundary line, the classification unit 113 estimates a write level by determining which of the boundary lines the coordinates in the feature space where each memory cell is located are between by using the threshold voltage VthA and $\Delta Vth_{RD}$ of each memory cell, in addition to the boundary line information obtained by the boundary estimation unit 112.

Figure 9:
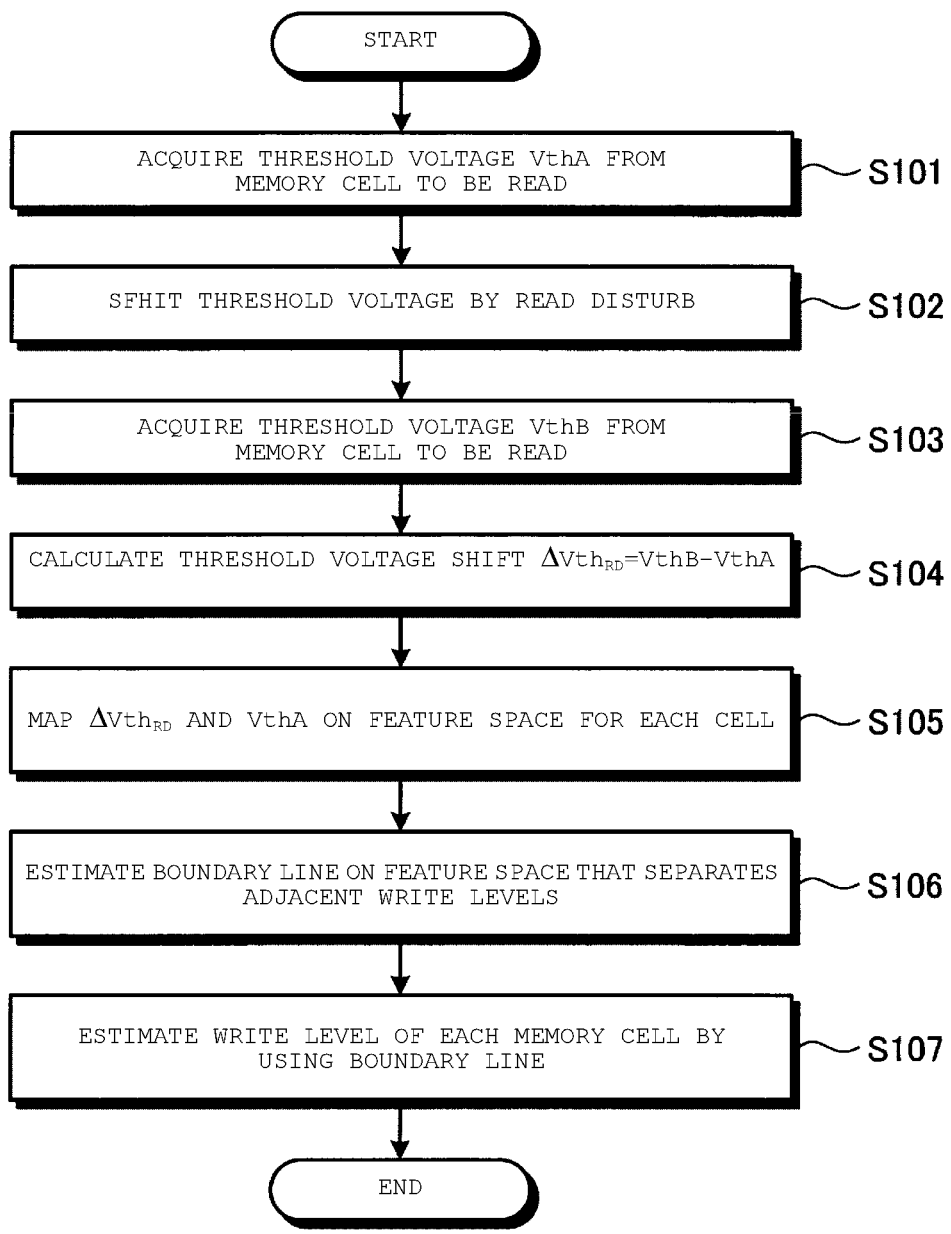
FIG. 9 is a flowchart showing estimation processing in a first embodiment.

Next, write level estimation processing performed by the memory controller according to the first embodiment configured as described above will be described with reference to FIG. 9. FIG. 9 is a flowchart showing an example of estimation processing in the first embodiment. As described above, the estimation processing is executed when, for example, the error correction fails.

First, in response to the control command sent by the read control unit 21, the detection unit 22 acquires the threshold voltages VthA for the plurality of memory cells to be read (step S101). The read control unit 21 issues a control command for generating read disturb to vary the threshold voltage of the memory cells to be read (step S102). The detection unit 22 again acquires the threshold voltage of the memory cells to be read as the threshold voltage VthB (step S103). The subtraction unit 111 calculates the shift amount $\Delta Vth_{RD}$ for each memory cell in accordance with the above-described equation (1) (step S104).

The boundary estimation unit 112 maps $\Delta Vth_{RD}$ and VthA for each memory cell onto a feature space spanned by these two axes (step S105). The boundary estimation unit 112 estimates a boundary line in the feature space that separates adjacent write levels by obtaining a line that optimally divides the plurality of sets (groupings) formed in the feature space (step S106). The classification unit 113 estimates the write level for each memory cell based on the estimated boundary line (step S107).

By performing the above processing on the memory cells existing in all the data areas, it is possible to reduce the errors induced by data retention to reproduce data as initially written.

As described above for specific examples, the nonvolatile memory controller 5 measures the threshold voltage shift caused by read disturbs when reading the data so as to estimate a write level by using both the shift amount and the threshold voltage of each memory cell. Therefore, as compared with the case where a write level is estimated by using only the distribution of the threshold voltages after read disturbs, if the number of times the read disturb is generated is the same for each memory cell, it is possible to estimate the write levels with higher accuracy. In other words, even in a case where the number of times the read disturb has occurred is small, it is possible to estimate a write level with higher accuracy. Therefore, it is possible to achieve the improvement of the processing speed and reduction of errors at the same time.

In the above example, an example of connecting the valleys of the distributions of different memory cell groups as classified with the K-Means method is disclosed as a method of obtaining a boundary line or the $\Delta Vth_{RD}$ axis, but it is also possible to estimate a boundary line based on other methods. For example, it is also possible to estimate each boundary line robustly by utilizing the tendency that boundary lines become closer to each other and using the deviation from the average value of the slope of each boundary line as a regularization term.

In addition, the feature space was defined by the threshold voltage VthA and the difference (shift amount $\Delta Vth_{RD}$ of threshold voltage) between the threshold voltage VthA and the threshold voltage VthB, but a feature space having two axes with one being the threshold voltage VthA and the other being threshold voltage VthB may be used. Even with such a feature space, it is possible to estimate a write level by the procedure described above.

Second Embodiment

Figure 10:
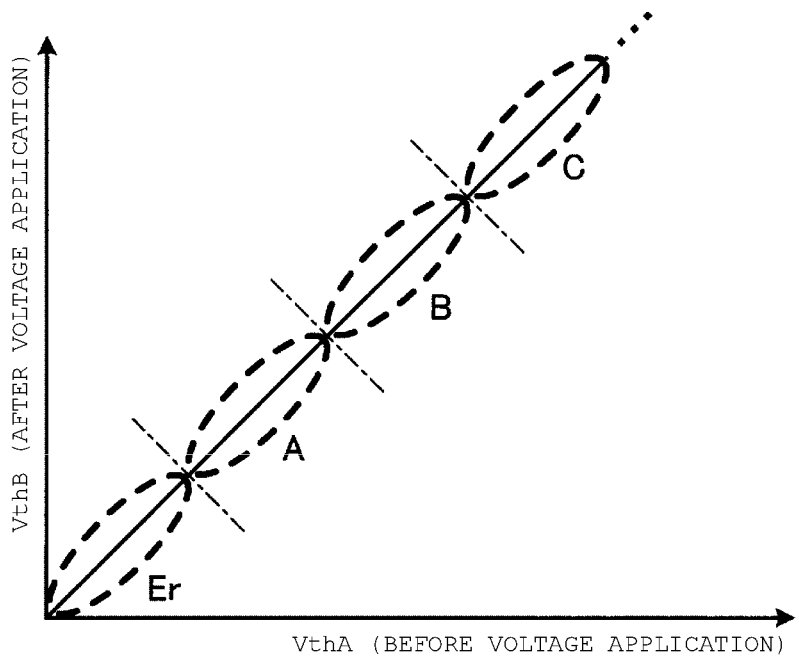
FIG. 10 is a diagram showing an example of a threshold voltage distribution related to a second embodiment.
Figure 11:
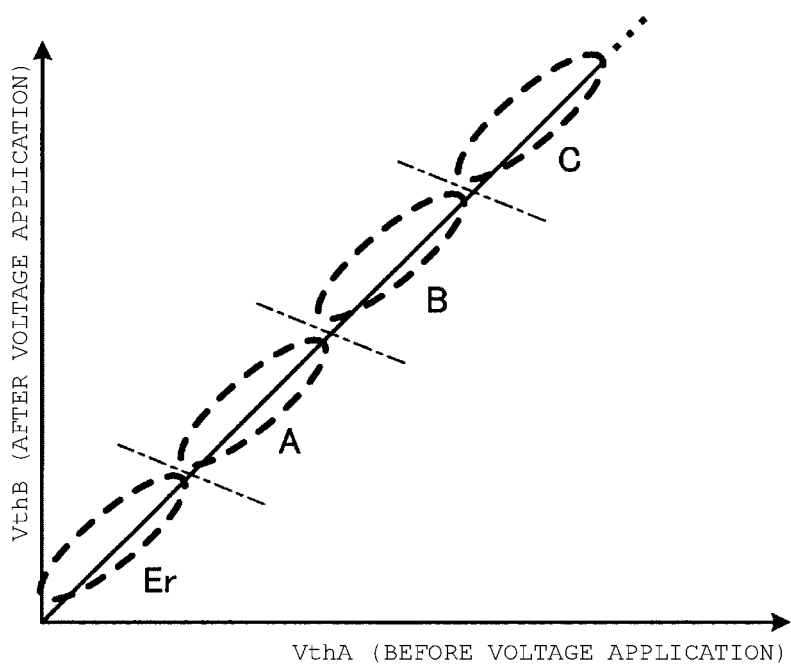
FIG. 11 is a diagram showing an example of the threshold voltage distribution related to a second embodiment.

In the first embodiment, after the threshold voltages of the memory cells are obtained before and after the voltage application, a boundary line separating the write levels is obtained by estimation. A second embodiment relates to a method of obtaining a boundary line requiring a smaller number of reads. In order to reduce the number of reads, a space having both of VthA and VthB as axes is considered as a feature space. Immediately after writing, each write level is along a straight line having a slope=1, as shown in FIG. 10. When time elapses from writing, the slope of each distribution decreases, as shown in FIG. 11, because the threshold voltage of certain memory cells decreases.

Specifically, in the second embodiment, a boundary line represented by a predetermined function (for example, a straight line, a quadratic function, an ellipse, or the like) is assumed as a boundary line separating the write levels. The estimation unit obtains the boundary line by deriving the parameters of a function from a plurality of pieces of read data before and after applying the voltage. For example, in a case where the boundary line is represented by a straight line, immediately after writing, a straight line, whose slope is around −1 as a dot-dash line in FIG. 10, is a boundary line, but in the case of FIG. 11 in which time has elapsed from the writing, the slope of the boundary line is changed. Hereinafter, in order to simplify the description, description will be limited to a case of obtaining a boundary line between two write levels. A similar method may be applied to the case of obtaining a boundary line of three or more write levels.

Figure 12:
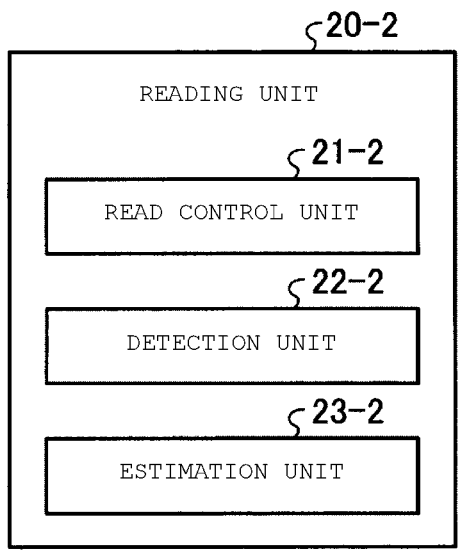
FIG. 12 is a block diagram showing a configuration example of a reading unit in a second embodiment.

FIG. 12 is a block diagram showing a configuration example of a reading unit 20-2 in the second embodiment.

Since the configuration of the memory system of the second embodiment other than the reading unit 20-2 is the same as that of FIG. 1, a detailed description thereof will be omitted. As shown in FIG. 12, the reading unit 20-2 includes a read control unit 21-2, a detection unit 22-2, and an estimation unit 23-2.

Before applying a predetermined first voltage, the read control unit 21-2 issues a command for reading with a predetermined M number (where M is an integer of 2 or more) of read voltages. In addition, after applying the predetermined first voltage, the read control unit 21-2 issues a command for reading with predetermined N number (where N is an integer of 2 or more) of read voltages. The larger the values of M and N are, the higher the accuracy of estimation will be. However, since the number of reads increases with increasing M and/or N values, the processing also time increases. Therefore, appropriate values of M and N may be determined according to processing speed requirements or the like.

The detection unit 22-2 measures a read result (read data) in response to the command issued by the read control unit 21-2. The read data of the second embodiment is, for example, a bit value ("1" or "0") determined according to the applied read voltage. From M read operations with different read voltages, a set of results (Results A1, Results A2 . . . Results AM) is obtained with the M read voltages. From N read operations with different read voltages, a set of results (Results B1 . . . Results BN) is obtained with the N read voltages. The read results for each of the M of read voltages include a plurality of bit values corresponding to the plurality of memory cells being read.

The estimation unit 23-2 estimates a write level corresponding to the write data written in the read cell based on the Results A and the Results B measured by the detection unit 22-2.

For example, the estimation unit 23-2 determines (M+1) read voltages to be used for each of (M+1) classes that classify the plurality of memory cells based on the results of the bit operation between the M read results (Result A1 . . . AM) and the N read results (Result B1 . . . BN). The estimation unit 23-2 estimates a write level corresponding to the write data based on the determined read voltages.

Figure 13:
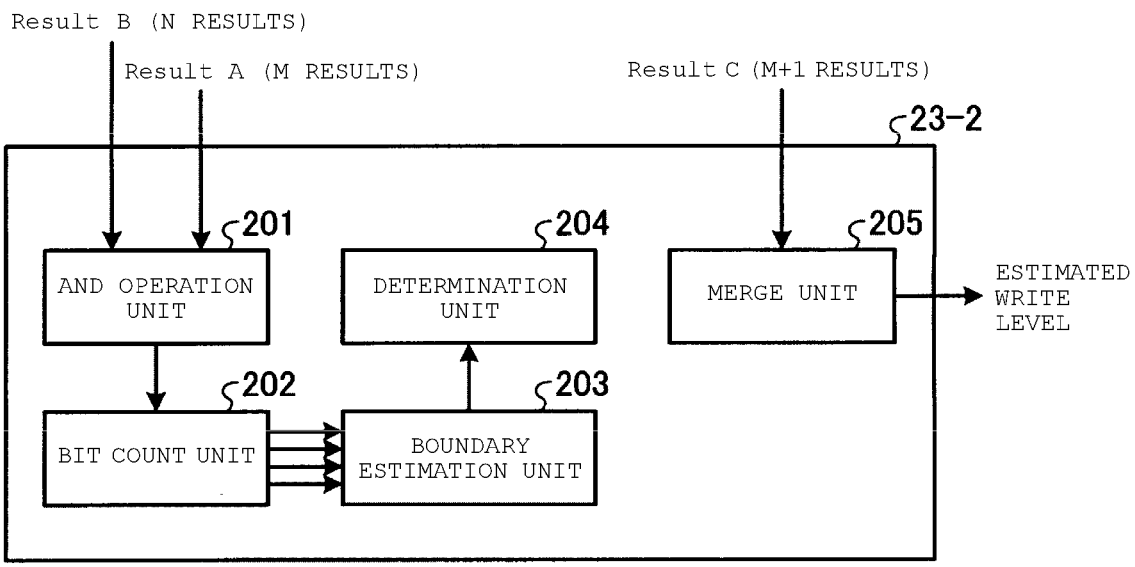
FIG. 13 is a block diagram showing a configuration example of an estimation unit in a second embodiment.

FIG. 13 is a block diagram showing an example of a detailed configuration of the estimation unit 23-2. As shown in FIG. 13, the estimation unit 23-2 includes an AND operation unit 201, a bit count unit 202, a boundary estimation unit 203, a determination unit 204, and a merge unit 205.

The AND operation unit 201 performs an AND operation for each bit (for each memory cell) for each combination of a plurality of read results before and after the predetermined voltage is applied. The bit count unit 202 counts the number of bits for which the result of the AND operation is "1" for each combination.

For example, in the case of reading twice (M=2 and N=2) before and after voltage application, the AND operation result of the following four combinations may be generated between Result A1 and Result A2 which are two reading results before voltage application and Result B1 and Result B2 which are two reading results after voltage application.

The bit count unit 202 calculates four count values corresponding to each of the four combinations.
(C1) Result A1 & Result B1
(C2) Result A1 & Result B2
(C3) Result A2 & Result B1
(C4) Result A2 & Result B2

The boundary estimation unit 203 estimates a boundary line that separates the distribution of points corresponding to a plurality of write levels on the feature space (two-dimensional feature space with VthA and VthB as axes) determined by the M read results (Result A1 . . . AM) and the N read results (Result B1 . . . BN). For example, the boundary estimation unit 203 inputs the count values which are the results of the bit operation and estimates a boundary line by using a function that outputs the parameters of the boundary line.

For example, in the case of assuming a straight line as a boundary line, two parameters are "slope" and "offset". In this case, "slope" and "offset" of the boundary line are acquired by preparing a corresponding function for each of these two parameters and inputting the count values. The function for calculating the parameters may be, for example, a first-order polynomial or a second-order polynomial. The coefficients of the polynomial may be predetermined values according to the number of reads and positions before and after voltage application, the characteristic of the NAND device, and the like.

The determination unit 204 determines (M+1) read voltages to be used for reading based on the estimated boundary line. In the above example of M=2, when two read voltages are VA1 and VA2, it is possible to separate each memory cell into three classes whose threshold voltage is less than VA1, VA1 to VA2, and VA2 or more. As described above, in the present embodiment, since reading is performed with M different read voltages before voltage application, from this read result, it is possible to classify each memory cell into (M+1) different classes. For each (M+1) class, the determination unit 204 determines a read voltage based on the estimated boundary line. In the example of M=2, three read voltages are defined as follows: class less than VA1, class of VA1 to VA2, and class of VA2 or higher. For the class less than VA1, the VthB axis coordinates of the intersection points of the boundary line on the feature space and the straight line of VthA=VA1 set the read voltage range for the class. For the class of VA1 to VA2, the VthB axis coordinates of the intersection points of the boundary line on the feature space and the straight line of VthA=(VA1+VA2)/2 set the read voltage range for the class. For the class of VA2 or higher, the VthB axis coordinates of the intersection points of the boundary line on the feature space and the straight line of VthA=VA2 set the read voltage range for the class.

The read control unit 21-2 issues a command to read with the read voltages determined by the determination unit 204. In this manner, (M+1) read results (Result C1 . . . Result C(M+1) corresponding to the (M+1) kinds of classes are obtained.

The merge unit 205 generates and outputs a read result (corrected read result) obtained by merging the read result Result C for each of the (M+1) classes.

Figure 14:
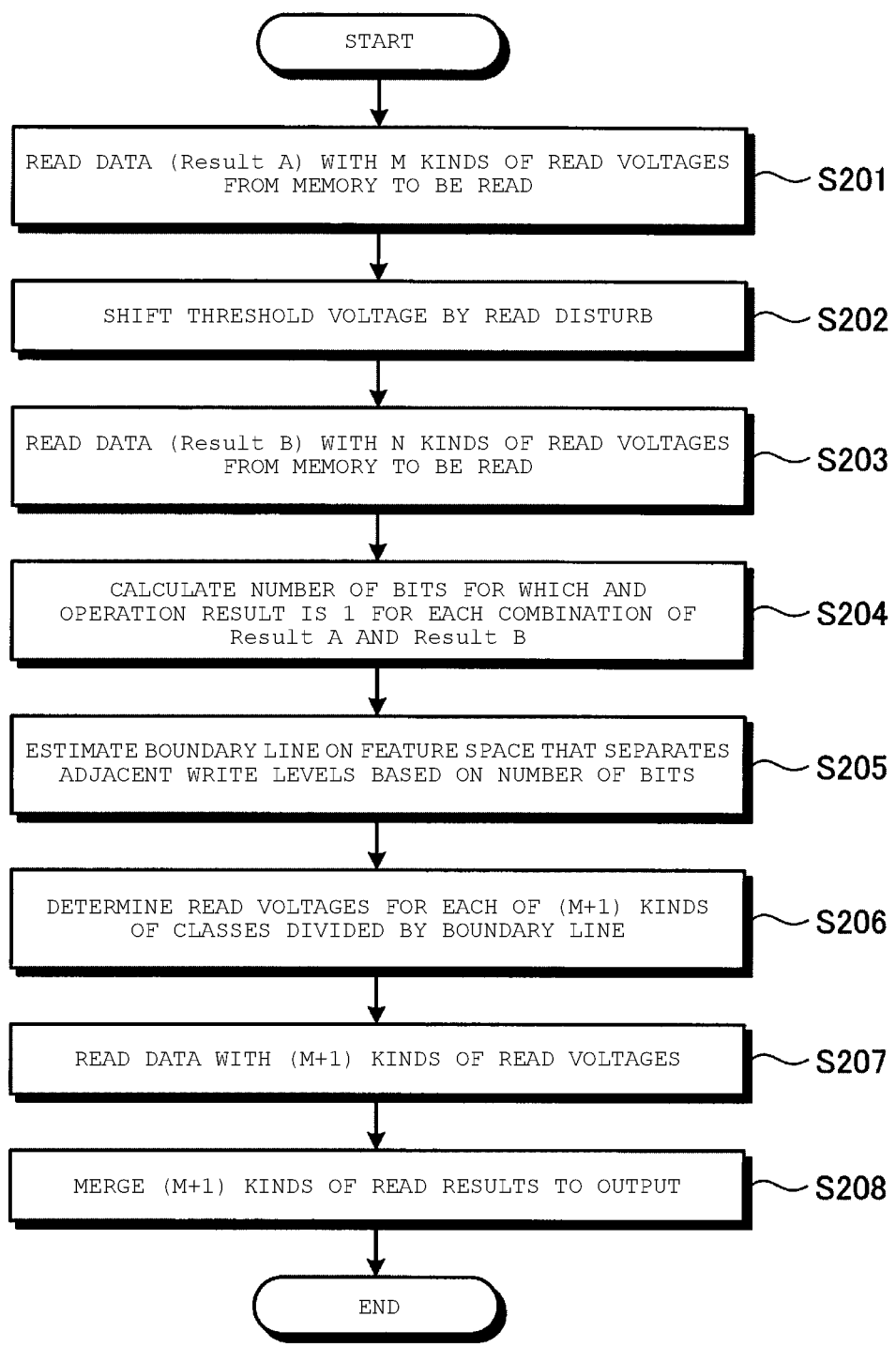
FIG. 14 is a flowchart of estimation processing in a second embodiment.

Next, estimation processing in the second embodiment configured as described above will be described with reference to FIG. 14. FIG. 14 is a flowchart showing an example of estimation processing in the second embodiment.

The read control unit 21-2 issues a command for reading data (obtain Results A) at M read voltages. In response to this command, the detection unit 22-2 acquires the read results Results A1 . . . AM (step S201).

The read control unit 21 issues a control command for generating read disturb to shift the threshold voltage of the read cell (step S202).

The read control unit 21-2 further issues a command for reading data (read result Result B) with N kinds of read voltages. In response to this command, the detection unit 22-2 acquires N read results (Results B1 . . . BN) (step S203).

The AND operation unit 201 performs an AND operation for each bit (for each memory cell) for each combination of read results before and after voltage application. The bit count unit 202 counts the number of bits for which the result of the AND operation is "1" (step S204).

The boundary estimation unit 203 calculates parameters of the boundary line by inputting the obtained count value to a preset function (step S205). The determination unit 204 determines (M+1) read voltages based on the obtained boundary line (step S206).

The read control unit 21-2 issues a command for reading the data (obtain Results C) with the determined read voltages. In response to this command, the detection unit 22-2 acquires (M+1) read results (Result C1 . . . Result C(M+1)) (step S207).

The merge unit 205 merges the Results C for each of the (M+1) kinds of class to output the merged read result as the estimated write level (step S208).

In the above example, an example in which the read voltage for each class is obtained after obtaining the boundary line is shown, but it is also possible to calculate the read voltage directly from the bit count by summarizing this processing. For example, a model in which the relationship between the bit count value of each class obtained by the bit count unit 202 and an appropriate read voltage is learned in advance is created. The estimation unit 23-2 may obtain the read voltage by utilizing this model.

As described above, in the memory controller according to the second embodiment, the boundary line may be obtained with a smaller number of reads. Therefore, it is possible to further improve the processing speed.

Modification Example 1

Above, examples in which each processing is executed by the controller 3 were described. However, in a modification of these previous examples, at least a part of the processing performed by the controller 3 in previously described examples may be performed within the nonvolatile memory 2.

In addition, in further examples, at least a part of the processing performed by the controller 3 in the previously described examples may be performed by an apparatus outside the memory system 1 (for example, the host CPU 4 and a server apparatus for a cloud environment). In this manner, various functions of the controller 3 may be provided in a storage system by combinations of the controller 3, the nonvolatile memory 2, the host CPU 4, and the like.

Supplementary Description

The writing unit, the reading unit (including e.g., a read control unit, a detection unit, and an estimation unit), and the ECC processing unit provided in the nonvolatile memory controller described above can be implemented by one or a plurality of processors. For example, each of the above units may be implemented by causing a processor, such as a central processing unit (CPU), to execute a program, that is, by software. In addition, each of these units may be implemented by a dedicated integrated circuit (IC), that is, hardware. In addition, these units may be implemented by a combination of software and hardware together. In the case of using a plurality of processors, individual processors may provide one of the units, or may provide two or more of the above units.

As described above, according to the first and second embodiments, it is possible to estimate a write level with high accuracy for nonvolatile memory in which an error rate varies for each memory cell due to the influence of the thickness of the tunnel layer and read/write stress.

A program to be executed by the memory controller according to the first or second embodiment can be provided by being incorporated in advance in a ROM or the like.

The program to be executed by the memory controller according to the first or second embodiment may be recorded on a computer-readable recording medium such as a compact disk read-only memory (CD-ROM), a flexible disk (FD), a compact disk recordable (CD-R), a digital versatile disk (DVD), and the like in a file of installable format or executable format and provided as a computer program product.

Further, the program to be executed by the memory controller according to the first or second embodiment may be configured to be provided by being stored on a computer connected to a network such as the Internet and being downloaded via the network. In addition, the program executed by the memory controller according to the first or second embodiment may be provided or distributed via a network such as the Internet.

The program executed by the memory controller according to the first or second embodiment allows the computer to function as each unit of the memory controller described above. This computer may read and execute the program from a computer-readable storage medium on a main storage device by a CPU.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A memory system, comprising:
  a plurality of memory cells capable of having data written therein at a plurality of write levels; and
  a memory controller configured to detect first data of the plurality of memory cells, then apply a first voltage that is lower than a voltage used for writing the data, to the plurality of memory cells, detect second data of the plurality of memory cells after the first voltage has been applied, and estimate a write level for the data written to the plurality of memory cells based on a comparison of the first data and the second data.

2. The memory system according to claim 1, wherein the memory controller is configured to estimate boundary lines between groupings of points in a feature space defined by the first data and the second data to estimate the write level corresponding to data written to the plurality of memory cells.

3. The memory system according to claim 2, wherein
  the first data comprises the threshold voltage for each of memory cell in the plurality of memory cells, and
  the second data comprises the threshold voltage for each memory cell in the plurality of memory cells after the first voltage has been applied to the plurality of memory cells.

4. The memory system according to claim 3, wherein the memory controller estimates a boundary line by assuming that the larger a difference between the threshold voltage for a memory cell in the first data and the threshold voltage for the memory cell in second data the greater a shift in threshold voltage for the memory cell due to the changes over time.

5. The memory system according to claim 3, wherein the memory controller estimates the boundary lines by evaluating a clustering of points on the feature space.

6. The memory system according to claim 1, wherein
the first data includes M pieces of data obtained from the plurality of memory cells before the first voltage has been applied by using M different read voltages, where M is an integer greater than or equal to 2, and
the second data includes N pieces of data obtained from the plurality of memory cells by using N different read voltages, where N is an integer greater than or equal to 2.

7. The memory system according to claim 6, wherein
the first data and the second data are data indicating bit values corresponding to the different read voltages, and
the memory controller determines M+1 different read voltages for each of M+1 classes of the memory cells in the plurality of memory cells based on the result of a bit operation between the M pieces of the first data and the N pieces of the second data to estimate the write levels corresponding to the write data.

8. The memory system according to claim 7, wherein the memory controller inputs a result of the bit operation and estimates the boundary line by using a function that outputs a boundary line that separates points on a feature space defined by the first data and the second data into a plurality of write levels to determine the (M+1) read voltages based on the estimated boundary line.

9. The memory system according to claim 7, wherein the memory controller determines the (M+1) read voltages based on a predetermined model relationship between the result of the bit operation and the read voltage.

10. The memory system according to claim 1, wherein the first voltage is a voltage applied when data is read from a word line that is different from a word line including the plurality of memory cells.

* * * * *